US006723541B2

(12) United States Patent
Sugii et al.

(10) Patent No.: US 6,723,541 B2
(45) Date of Patent: Apr. 20, 2004

(54) METHOD OF PRODUCING SEMICONDUCTOR DEVICE AND SEMICONDUCTOR SUBSTRATE

(75) Inventors: Nobuyuki Sugii, Tokyo (JP); Shinya Yamaguchi, Mitaka (JP); Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/163,312

(22) Filed: Jun. 7, 2002

(65) Prior Publication Data

US 2003/0013305 A1 Jan. 16, 2003

(30) Foreign Application Priority Data

Jul. 12, 2001 (JP) .......................... 2001-211801

(51) Int. Cl.[7] .......................... H01L 21/00; H01L 21/20; H01L 21/22
(52) U.S. Cl. .......................... 435/166; 438/487; 438/542; 438/541; 438/198; 438/172; 438/590; 438/593; 438/933
(58) Field of Search .......................... 438/510, 161, 438/162, 163, 166, 487, 542

(56) References Cited

U.S. PATENT DOCUMENTS

| 5,461,243 | A | | 10/1995 | Ek et al. ..................... 257/190 |
| 6,118,151 | A | * | 9/2000 | Tsutsu ..................... 257/347 |
| 6,350,993 | B1 | * | 2/2002 | Chu et al. ..................... 257/19 |
| 6,372,593 | B1 | * | 4/2002 | Hattori et al. ............... 438/311 |
| 6,429,061 | B1 | * | 8/2002 | Rim ..................... 438/198 |
| 6,461,945 | B1 | * | 10/2002 | Yu ..................... 438/510 |

FOREIGN PATENT DOCUMENTS

| JP | 7-169926 | 7/1995 |
| JP | 9-321307 | 12/1997 |
| JP | 2000-243946 | 9/2000 |

OTHER PUBLICATIONS

M. V. Fischetti et al., "Band structure, deformation potentials, and carrier mobility in strained Si, Ge, and SiGe alloys," Journal of Applied Physics 80 (4), Aug. 15, 1996, pp. 2234–2252.

A.R. Powell et al., "New approach to the growth of low dislocation relaxed SiGe material," Applied Physics Letter 64 (14), Apr. 4, 1994, pp. 1856–1858.

N. Sugiyama et al., "Formation of strained–silicon layer on thin relaxed–SiGe/SiO$_2$/Si structure using SIMOX technology," Thin Solid Films 369 (2000), pp. 199–202.

* cited by examiner

Primary Examiner—John F. Niebling
Assistant Examiner—Ron Pompey
(74) Attorney, Agent, or Firm—Miles & Stockbridge P.C.

(57) ABSTRACT

A method of producing a strain-relaxed Si—Ge virtual substrate for use in a semiconductor substrate which is planar and of less defects for improving the performance of a field effect semiconductor device, which method comprises covering an Si—Ge layer formed on an SOI substrate with an insulating layer to prevent evaporation of Ge, heating the mixed layer of silicon and germanium at a temperature higher than a solidus curve temperature determined by the germanium content of the Si—Ge layer into a partially melting state, and diffusing germanium to the Si layer on the insulating layer, thereby solidifying the molten Si—Ge layer to obtain a strain-relaxed Si—Ge virtual substrate.

10 Claims, 13 Drawing Sheets

METHOD OF PRODUCING SEMICONDUCTOR DEVICE AND SEMICONDUCTOR SUBSTRATE

BACKGROUND OF THE INVENTION

1. Field of the Invention

This invention relates to a method of producing a substrate for use in a semiconductor device and a method of producing a semiconductor device using the same.

2. Related Art

In integrated circuits using insulated gate type field effect transistors (hereinafter simply referred to as Si-MOSFET) using silicon, a reduction in power consumption and an increase in operation speed have been compatibilized by diminishing the size of a device or lowering an operation voltage in accordance with the so-called scaling rule. However, since the gate length has been decreased to as short as 0.1 $\mu$m or less in recent years, there are various problems such as the short-channel effect and a reduction in an operation margin due to proximity of the drain voltage and the threshold voltage. Further, referring to the mobility as an index for the increase in the operation speed, various improvements described above rather provide a contrary result of lowering the mobility of actual Si devices. As described above, a further improvement in performance has become very difficult in existing Si-MOSFETs.

Further improvement in performance requires increasing the operation speed by utilizing a field effect transistor using SOI (silicon on insulator) on the one hand and by improving the semiconductor material itself on the other hand.

Considering that the existing Si processing technology capable of high integration is widely, utilized the most practical method for solving the problem is to provide a semiconductor device having a field effect transistor with a low power consumption and high operation speed by using Si or a combination thereof with a homologous element Ge in addition to the SOI technology.

Specifically, improvement can be attained by applying strain, by means of a strain-applying semiconductor layer, to a layer in which channels of a field effect transistor are formed, thereby increasing the mobility of carriers in the channel to a value greater than that of the material in an unstrained channel forming layer. That is, when the material of the channel forming layer is Si, the lattice constant within the plane of the Si channel forming layer is increased by applying stain to a value greater than that of unstrained Si.

It is theoretically suggested that when strains are applied to Si or Ge, mobility of carriers can be increased compared with Si or Ge with no strains. This is described, for example, in the article (written by M. V. Fischetti and S. E. Laux), in Journal of Applied Physics (J. Appl. Phys.) vol. 80 (1996), p 2234.

One method of applying strain to Si comprises growing an Si—Ge alloy film with a sufficient thickness on an Si substrate and growing an Si thin, film further thereon has generally been used. When an Si—Ge alloy film with a sufficient thickness is grown, dislocation occurs in the film and, at the same time, the lattice constant within the growing plane of the Si—Ge alloy film increases compared with that of bulk Si—Ge. That is, the lattice strain of the Si—Ge film is relaxed. When an Si film is grown on the thus grown stress-relaxed Si—Ge film, the Si film undergoes biaxial tensile strain within the plane.

On the other hand, there is a second method comprising a combination of SOI technique and Si—Ge. That is, a method of forming an Si—Ge layer on an existent SOI substrate to relax strains has been attempted. This is described, for example, in Japanese Patent Laid-open No. Hei 7-169926, or in the paper (by A. R. Powell, S. S. Iyer and F. K. LeGoues), in Applied Physics Letter (Appl. Phys. Lett), vol. 64 (1994), p 1856. As the third method, a method of forming a stress relaxation Si—Ge layer on an Si oxide film by oxygen ion implantation separation method (SIMOX) has also been attempted. This is described, for example, in Japanese Patent Laid-open No. Hei 9-321307 or in the paper (by N. Sugiyama, T. Mizuno, S. Takagi, M. Koike and A. Kurobe), in "Thin Solid Films", vol. 369 (2000), p 299. Further, as the fourth method, Japanese Patent Laid-open No. 2000-243946 discloses a method of laminating an Si—Ge layer on an SOI substrate and then conducting strain relaxation while diffusing Ge by heat treatment or an oxidizing step.

SUMMARY OF THE INVENTION

An object of this invention is to provide a method of producing a substrate for use in a semiconductor device that is sufficiently planar and with less defect density, as well as a method of producing a high performance semiconductor device using the same.

According to a typical aspect of the present invention, there is provided a method of producing a substrate for use in a semiconductor device comprising the steps of forming a mixed crystal layer of silicon and germanium (hereinafter, the mixed crystal of silicon and germanium is referred to as Si—Ge and a mixed crystal layer of silicon and germanium as Si—Ge alloy layer) on a single crystal silicon layer (hereinafter, referred to as single crystal Si layer) formed on an insulating layer, melting the Si—Ge layer and solidifying the Si—Ge layer while diffusing germanium (hereinafter referred to as Ge) from the Si—Ge layer to the single crystal Si layer.

According to another aspect of the present invention, there is provided a method of producing a substrate for use in a semiconductor device comprising the steps of forming an Si—Ge layer on a single crystal Si layer formed on an insulating layer, melting the Si—Ge layer at a temperature higher than the solidus curve temperature determined by the Ge content of the Si—Ge layer and at a temperature lower than the solidus curve temperature determined by the Ge content in the mixed layer of the single crystal Si layer and the Si—Ge layer and solidifying the Si—Ge layer in accordance with the lowering of the Ge content in the Si—Ge layer.

Preferably, at least one of an Si layer and an insulating layer is formed on the Si—Ge layer and then the Si—Ge layer is melted.

It will be apparent that a method of producing a semiconductor device by forming at least a single crystal Si layer on the substrate formed according to the invention and forming a semiconductor device using the single crystal Si layer as a base material is useful. In this case, a step of forming an Si layer on the stress-relieved Si—Ge layer of a Si—Ge virtual substrate, a step of forming a gate insulation film and a gate electrode, a step of forming source-drain regions and a step of forming wirings are conducted, and such steps can be conducted by usual methods. Further, in actual production of a semiconductor integrated circuit device, it is preferred to define regions of a multiple-layer structure comprising the single crystal Si layer and the Si—Ge layer before the step of melting the Si—Ge layer and then conduct subsequent steps for the production of the semiconductor device.

DESCRIPTION OF THE PREFERRED EMBODIMENTS

Prior to illustration of specific embodiments, the principle of the invention and the like is explained in detail.

The present inventors have made detailed studies on the stress relaxing process for an Si—Ge layer formed on an SOI layer and, as a result, have found that the method described below provides strain relaxation and is important for the production of an Si—Ge semiconductor substrate on a less defective and planar insulating layer. Usually, a single crystal silicon layer is formed intermediating a silicon oxide film on a silicon substrate in an SOI substrate. This invention concerns production of a semiconductor substrate in which an Si—Ge layer is formed on the single crystal silicon layer.

A first feature of this invention is that a temperature above a solidus curve determined by the Ge Content of the initial Si—Ge layer is set when melting the Si—Ge layer by a heat treatment, thereby forming a partially melted state of the Si—Ge layer, from which Ge is diffused to the Si layer on the insulating layer. This can relax strains and enables production of an Si—Ge semiconductor substrate formed on a less defective and planar insulating layer.

In accordance with the second feature, the Si—Ge layer is covered with an insulating film to prevent evaporation of Ge upon heat treatment of the Si—Ge layer, thereby enabling a heat treatment at higher temperature, more strain relaxation and enabling production of an Si—Ge semiconductor substrate formed on a less defective and planar insulating layer.

Figure 1:
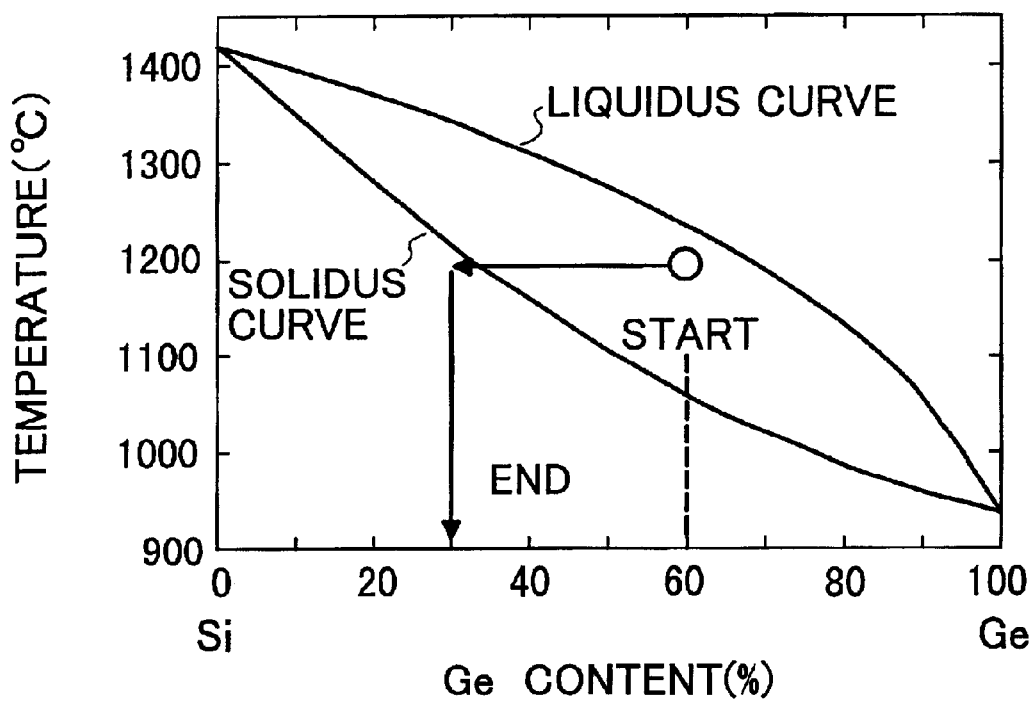
FIG. 1 is an Si—Ge phase diagram showing a method of solving problems in the invention.

The principle described above is to be explained with reference to FIG. 1. FIG. 1 is a phase diagram for an Si—Ge system. The abscissa of the graph represents the Ge content of Si—Ge and the ordinate represents the temperature. Of the two curves in the graph, the upper curve is referred to as a liquidus curve. The system is in a completely melted liquid state in the region higher than the liquidus curve. The lower curve is referred to as a solidus curve. The system is in a solid state in the region lower than the solidus curve. A region between the two curves shows a partially melting state.

A case is taken as an example where an Si—Ge layer of 50 nm thickness and with 60% Ge content is deposited to an SOI layer (Silicon On Insulator) of 50 nm thickness for heat treatment. When the SOI layer and the Si—Ge layer are completely mixed together, an Si—Ge film of 100 nm thickness and with 30% Ge content is formed. When the film is heat treated at 1200° C., since the Si—Ge layer contains 60% Ge in the initial state, it is in a partially molten state as indicated by symbol "o" in the graph. When the heat treatment is continued at the same temperature, as Ge diffuses and the Ge content of the Si—Ge layer lowers, the phase proceeds as shown by a horizontal arrow and, finally, it lies below the solidus line. That is, the layer is solidified. What is important in this case is that a lower portion of the SOI layer below the Si—Ge layer in contact with the insulating layer does not melt over the entire heat treatment step. It is essential that when Ge diffuses into the SOI layer to form an Si—Ge layer, the lower portion of the SOI layer in contact with the insulating layer does not melt. Accordingly, when the upper Si—Ge layer is solidified, a single crystal is formed by liquid layer epitaxial growth from the lower crystal layer. In a case where the heat treatment temperature is excessively high, that is, when the phase is above the solidus curve even after the complete diffusion of Ge, the entire Si—Ge layer on the insulating layer is melted, and it is solidified in the temperature lowering step after the completion of the heat treatment. In this case, since the insulating layer is amorphous, a polycrystalline Si—Ge layer is formed. Therefore, it can be seen that, to grow a single crystalline Si—Ge layer of good crystallinity, it is most preferred to adopt such a temperature condition that the Si—Ge layer is molten in the initial state of the heat treatment and the Si—Ge layer solidified at the end of the heat treatment. In this case, it is not always necessary to make the temperature constant over the entire heat treatment process but it may suffice to satisfy the condition that the Si—Ge layer is melted at the initial state and solidified at the final state. It is apparent that this invention is different with respect to the fundamental idea regarding the crystal growth from the fourth method of the prior art described previously.

When the heat treatment is applied in a high temperature state set to the conditions described above, the possibility of forming crystal defects is extremely reduced because it takes a process of crystallization from the molten state. As can be seen from the case of Si or compound semiconductor crystals, crystals of high quality are always formed by crystallization from the liquid layer, that is, they are formed by pulling up single crystals by liquid phase epitaxial growth. It can be seen that the method of the invention is excellent particularly in growing Si—Ge crystals of high quality as described above. Particularly, there is a problem in the case of Si—Ge that the Ge content in the crystals lacks in homogeneity because of segregation accompanying movement of a molten zone when it is intended to pull up single crystals. However, in the method of this invention, since melt-solidification process is taken place in a space surrounded with the insulating layers and the total amount of Ge is preserved in the confined space, the Ge content is made uniform along with the heat treatment. Accordingly, the method of this invention is the only one high quality crystal growing method for the Si—Ge system, which is excellent even when compared with the crystal pulling up method.

Further, since this is a high temperature heat treatment, atoms slip easily at the interface between the Si—Ge layer and the insulating layer in contact therewith, so that strains in the Si—Ge layer can be relaxed effectively without causing dislocation.

In the next place, the production process for a semiconductor substrate is to be described successively. First, an SOI substrate is provided. There is no particular restriction on the production method for the SOI substrate, and it may be produced either by a wafer bonding technique or an SIMOX method (Separation by Implanted Oxygen Method). The thickness of the SOI layer (single crystal Silicon On Insulator) of the SOI substrate is optional and, preferably, 5 nm or more and 200 nm or less. This is because control for the film thickness of 5 nm or less is difficult and voids are formed in the SOI layer in the cleaning heat treatment process upon growing the Si—Ge layer thereon. Further, if it exceeds 200 nm, it is disadvantageous since the film thickness of the Si—Ge layer formed initially or the Ge content therein have to be increased in order to form an Si—Ge layer with a sufficient Ge ratio after the heat treatment (for Ge diffusion).

Since the thickness of the semiconductor layer on the insulating film required for an actually manufactured field effect semiconductor device is at most about 500 nm, it has no particular significance to increase the thickness of the Si—Ge layer to more than 500 nm. Accordingly, it is preferred that the thickness of the Si—Ge layer deposited on the SOI layer is also 5 nm or more and 500 nm or less. As described above, the Si—Ge layer may be formed in accordance with the requirement of the semiconductor device to be formed on the layer.

For the SOI substrate, the so-called SON (Silicon on Nothing) substrate in which a gap is disposed as an insulating layer may also be used in addition to the usual substrate in which $SiO_2$ is buried. In this case, however, it is preferred to add a step of thermally oxidizing the inner surface of the gap to prevent evaporation of Ge in the gap in the step before the diffusion heat treatment with the Si—Ge layer.

For the step of depositing the Si—Ge layer on the SOI substrate, a usual method for the growth of the Si—Ge film such as a low pressure CVD (Chemical Vapor Deposition) may be used and there is no particular restriction on the method. Since the surface of the Si—Ge layer is chemically less stable compared with Si, it is preferred to grow the Si film continuously with the growth of the Si—Ge film. The thus grown Si film is thermally oxidized and can be used as the insulating film for preventing the evaporation of Ge. However, it is preferred that oxidation is applied in this step only to Si on the surface and it does not reach the Si—Ge layer at the inside in order to decrease the defect density. Further, it is also preferred to use an Si nitride film instead of or in addition to the Si oxide film as the insulating film because the Si nitride film is excellent for diffusion barrier. Further, an insulating film such as of $SiO_2$ or SiN may also be deposited directly on the Si film or Si—Ge layer, for example, by a CVD method not by way of the thermal oxidization step.

In the step of forming the Si—Ge layer on the SOI substrate, the surface flatness may be worsened or dislocation may occur sometimes since the internal strains increase depending on the method for formation, the thickness and the Ge content of the Si—Ge layer. In such a case, it is preferred to form the layer under the conditions of forming not a crystal layer but an amorphous layer and then apply a crystallization treatment, since the surface flatness can be maintained. In a case where the amorphous layer is formed by a usual CVD method, it may be conducted by lowering the growing temperature but this may sometimes greatly deteriorate the growing speed. In such a case, a method of efficiently decomposing starting gases by plasma-assisted or photo-assisted may be adopted. Alternatively, when the surface of the SOI substrate is slightly oxidized, or Si—Ge layer is formed after depositing an extremely thin silicon oxide film, the growing temperature can be increased and the amorphous film can be deposited compared with a case of not applying oxidation or coating, and the problem with the lowering of the growing rate can be overcome. In this case, the layer covered on the surface of the SOI substrate diffuses in the subsequent heat treatment process to moderate the effect on the crystallinity of the Si—Ge layer.

After forming the Si—Ge layer and a layer for covering the same on the SOI substrate, the process goes to the heat treatment step. Before the heat treatment step, regions may be isolated, for example, by forming a trench in each of the layers laminated on the insulating film of the SOI substrate. In the strain-relaxed Si—Ge virtual substrate of this type, a semiconductor device such as a field effect transistor is usually formed. When an integrated circuit is manufactured by using such a device, the active region of the semiconductor film is often separated by disposing a device isolation region for isolating the device upon production of integrated circuits. The step can be conducted here. For example, a trench is formed from the main surface of the substrate till it reaches the insulating layer of the SOI substrate as described above and, further, the trench is filled with the insulator. In this case, since the SOI layer, the Si—Ge layer and the capping layer covering them are narrowed to a region surrounded with the trench to provide various advantages that the strains can be removed more easily compared with a case of covering the entire wafer surface, a problem of the wafer warp caused by the application of the strains over the entire wafer surface can be solved and, in addition, the additional problem with the occurrence of stresses caused by the insulator or the like buried in the device isolation region can also be overcome by the high temperature heat treatment in the subsequent step.

Then, the laminated film and the substrate are heat treated. As described above, it is preferred to conduct the treatment under the condition of melting the Si—Ge layer at the initial stage and solidifying the same upon completion of the heat treatment. The atmosphere for conducting the heat treatment is desirably an atmosphere containing 10% or less oxygen or an inert atmosphere. This is because when the heat treatment process is applied in an oxygen rich atmosphere, the oxidation of Si or Si—Ge may possibly progress from the surface. When oxidation should reach as far as the Si—Ge layer, only Si in the Si—Ge layer is selectively oxidized to increase the Ge concentration near the boundary, which makes it difficult to unify the Ge content in the Si—Ge layer and, in addition, a great amount of point defects are formed along with the oxidation to lower the crystal quality. The foregoing problems can be overcome by restricting the oxygen concentration in the atmosphere to 10% or less.

As described above, in a case where the heat treatment is applied after isolating the regions, it is not always necessary to elevate the heat treatment temperature to a temperature leading to a partial molten state of Si—Ge irrespective of those described above. That is, it is possible to obtain an Si—Ge film of good quality due to that defects tend to be released toward the device isolation region since the region for conducting strain relaxation is narrow. Apparently, it requires sufficient temperature and time to diffuse Ge and it is more desirable not to reach the molten state.

Irrespective of the advantages described above, it is of course possible for directly applying the diffusion heat treatment after the step of forming the insulating film, optionally, conducting removal of the upper insulating film and epitaxial growing of the Si layer or the like to obtain a Si—Ge virtual substrate for use in a strained Si semiconductor device and producing a semiconductor device by way of the device isolation step and the like.

The substrate after applying the strain relaxation heat treatment has a structure in which an Si—Ge layer and, further thereon, an insulating layer are laminated on the buried insulating layer of the basic SOI substrate and, depending on the case, the periphery is surrounded with a device isolation region. When an upper layer of the Si—Ge layer is removed by etching or the like, the strain-relaxed Si—Ge layer is exposed to the surface. When the Si-layer is epitaxially grown thereon, the Si layer undergoes tensile strain within the plane in accordance with the Ge content of the strain-relaxed Si—Ge layer. Considering a case of forming a field effect transistor having a strained Si channel, it is desirable that the amount of the strain is about 1% or more since the performance is improved and the deviation of the performance improvement by the deviation of the strain decreases. To provide the strain at such an extent, it may suffice that the Ge content in the stress relaxed Si—Ge layer is about 30% or more.

When there is a deviation in the thickness of the SOI layer of the SOI substrate, also a deviation of the Ge content occurs due to the feature of this method of determining the entire Ge content by the mutual diffusion with the Si—Ge layer. In a case where the deviation of the film thickness in the SOI layer is about 5% as the existing technical level, the deviation of the Ge content can be below 5% even when the thickness of the Si—Ge layer is made about equal with that of the SOI layer. When the Ge content is made within a range of about 30% or more as described above, the deviation gives no substantial effects on the deviation of performance of the field effect transistor. However, improvement has been made continuously for the deviation of the film thickness of the SOI layer and the condition of the Ge content is also weakened in accordance with the decrease in the deviation of the film thickness.

It is desirable that the thickness of the strained Si layer is about 50 nm or less relative to the amount of strain in order not to form dislocations in the strained Si layer itself thereby causing strain relaxation. On the other hand, when it is excessively thin, the performance may possibly be worsened undergoing the effect of the scattering due to the insulating layer, so that it is desirably 5 nm or more. Further, in this step, it is of course possible to deposit the Si layer for the protection of the Si—Ge layer in the process irrespective of the restricted range of the film thickness described above and then grow the strained Si layer as the channel in the succeeding step. In this case, the protective layer is not restricted only to the Si layer.

The Si—Ge virtual substrate obtained by the steps described above can serve as it is as the substrate for use in the semiconductor device.

Further, a field effect semiconductor device can be manufactured by using the substrate. For the substrate not yet formed with the device isolation region, a step of forming the device isolation regions is performed further. Since this is basically identical with the existing SOI substrate, it is preferred to adopt a device isolation method of forming trenches reaching the buried insulating layer and, optionally, burying an insulating film. The step is, of course, not necessary for a substrate in which the device isolation regions have already been formed.

Then, ion implantation and activating heat treatment for forming the well layer and preventing punch through are applied. Further, in a case where the strained Si layer for use in the channel is not formed in the Si—Ge virtual substrate, the upper protective layer is optionally removed and, subsequently, a strained Si layer is epitaxially grown. In this case, it is desirable to use a selective epitaxial growth method such that the Si layer does not grow as far as on the device isolation region.

Then, production of the field effect semiconductor device is completed by way of the steps such as ion implantation-activating treatment for controlling the threshold voltage, formation of a gate oxide film, formation of a gate electrode film, gate fabrication, formation of punchthrough stopper, source drain extension region and source-drain by ion implantation, formation of interlayer insulating film, and wiring. The type and the sequence of the steps described above are not restrictive but any of them may be adopted so long as a semiconductor device can be formed on the substrate obtained by the invention, by which the effect of the invention can be attained.

Comparison between This Invention and the Prior Art

In the next place, this invention is compared with the prior art described above. The first to fourth techniques cited herein are those techniques described in the paragraph of Related Art The first technique described above of forming the Si—Ge layer on the Si substrate and the second technique of forming the Si—Ge layer on the SOI substrate involve the following drawbacks: Dislocations are introduced into the Si—Ge alloy film in order to moderate the lattice mismatching. Therefore, this remarkably worsens the flatness on the surface of the Si—Ge alloy film and, further, it is extremely difficult to decrease the through dislocation density to 100,000 per cm$^2$. When a strained Si layer is grown on the surface of poor flatness and containing many defects to manufacture an MOSFET, the effect of increasing the mobility by strains is offset with the increase of the scattering of carriers and it also gives undesired effects on the fine lithography essential for the production of high performance device. Further, since the defect density is high, the device yield is not improved.

In the third technique, it is said that the strain relaxation is promoted and the through dislocation density is reduced somewhat by increasing the heat treatment temperature to 1050° C. However, since the surface is the Si—Ge layer, Ge may possibly be evaporated during heat treatment and further elevation of the heat treatment temperature is impossible and, accordingly, further lowering of the dislocation density is impossible. Further, since undulation is caused to the Si—Ge layer at the surface along with strain relaxation, it is difficult to improve the flatness.

Further, in the third technique, the buried insulating layer is formed by implanting oxygen ions into the Si—Ge layer and subsequent annealing. Accordingly, since a high temperature of about 1400° C. is necessary for the annealing, the Ge content had to be reduced 10% or less in order to prevent melting of the Si—Ge layer. Since about 20 to 30% of the Ge content is necessary for attaining remarkable increase in the mobility caused by the strain, no sufficient improvement can be expected for the performance by this method. In addition, since the buried insulating layer (silicon oxide) is formed while oxidizing the Si—Ge layer, the point defect density near the insulating film increases to result in a problem of low breakdown voltage of the buried insulating layer.

Further, in the fourth technique, since the heat treatment or oxidation is applied after coating the surface with the insulating layer, the problem of evaporation of Ge is not caused. However, since the heat treatment temperature is insufficient, it is difficult to obtain Si—Ge crystals of sufficiently high quality. Referring more specifically, the fourth method disclosed in a fourth embodiment of the above-mentioned document is that the heat treatment temperature has to be lowered along with an increase in the Ge content since the Si—Ge layer is sometimes deteriorated, or melted along with increase of the Ge content. However, as a result of the study made by the present inventors, even when Ge was diffused at a temperature not melting Si—Ge and the strain relaxation heat treatment was applied as in the fourth method, crystallinity was still insufficient and the defect density could not be decreased sufficiently. Further, since the heat treatment is conducted in the oxidized state in this example, it also results in a drawback that additional defects are formed by the oxidation of the Si—Ge layer.

This invention is to be described in details with reference to specific embodiments.

Embodiment 1

In Embodiment 1, a Si—Ge virtual substrate is formed actually on an SOI substrate, excellent crystallinity thereof is tested and the validity for the method of this invention is shown. In this embodiment, descriptions will be made specifically of production of planar substrate, strain relaxation, uniform composition, flatness (on strained Si layer) and low defect.

Figure 2A:
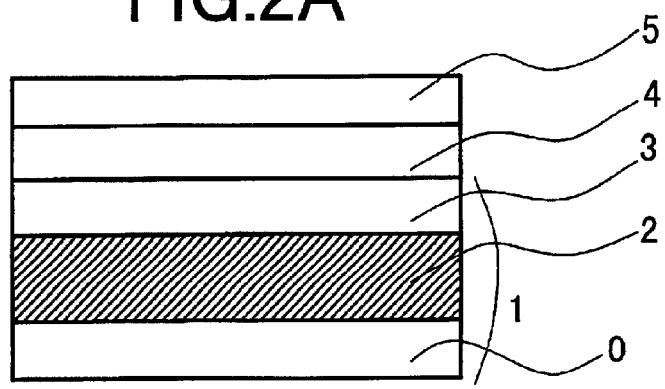
FIGS. 2A to 2C are cross sectional views showing steps of forming a Si—Ge virtual substrate on an SOI substrate of Embodiment 1 according to this invention.
Figure 2B:
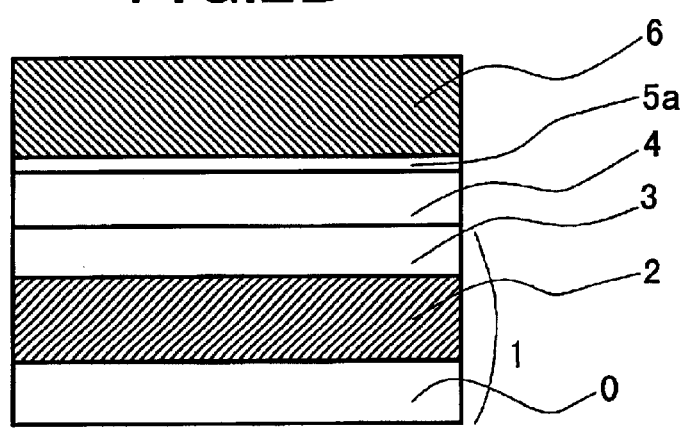
Figure 2C:
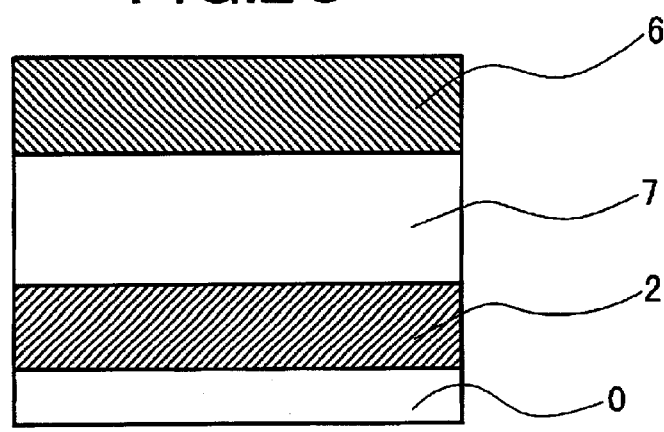

Procedures are described with reference to FIG. 2 comprising FIGS. 2A, 2B and 2C. FIGS. 2A to 2C are cross sectional views of a substrate, showing the order of steps for producing the substrate in this embodiment. An SOI substrate 1 was chemically cleaned and put in a molecular-beam epitaxy apparatus. The SOI substrate is a bonded SOI substrate comprising an SOI layer 3 of 50 nm thickness and a buried insulating layer 2 of 100 nm thickness. Reference 0 denotes a silicon substrate. In the molecular-beam epitaxy apparatus, surface cleaning was performed in ultrahigh vacuum state to deposit an Si—Ge layer 4 of 100 nm thickness and, successively, an Si-layer 5 of 50 nm thickness. The process was conducted in two ways of epitaxially growing at a deposition temperature of 600° C. and of depositing an amorphous film at room temperature and, finally, elevating the temperature to 600° C. to cause solid phase crystallization. The state is shown in FIG. 2A.

Subsequently, the substrate was taken out and subjected to wet thermal oxidation at 900° C. while leaving several nm thickness (5a) of the surface Si layer of 50 nm thickness in an electric furnace. As a result, an SiO$_2$ layer 6 of 100 nm thickness was formed on the surface (FIG. 2B). Thus, the Si layer and the insulating layer were formed on the Si—Ge layer. Further, a heat treatment was applied in a nitrogen atmosphere in the electric furnace within a temperature range from 1000° C. to 1200° C. for 2 hours. The state shown in FIG. 2C was attained in this step.

Figure 3:
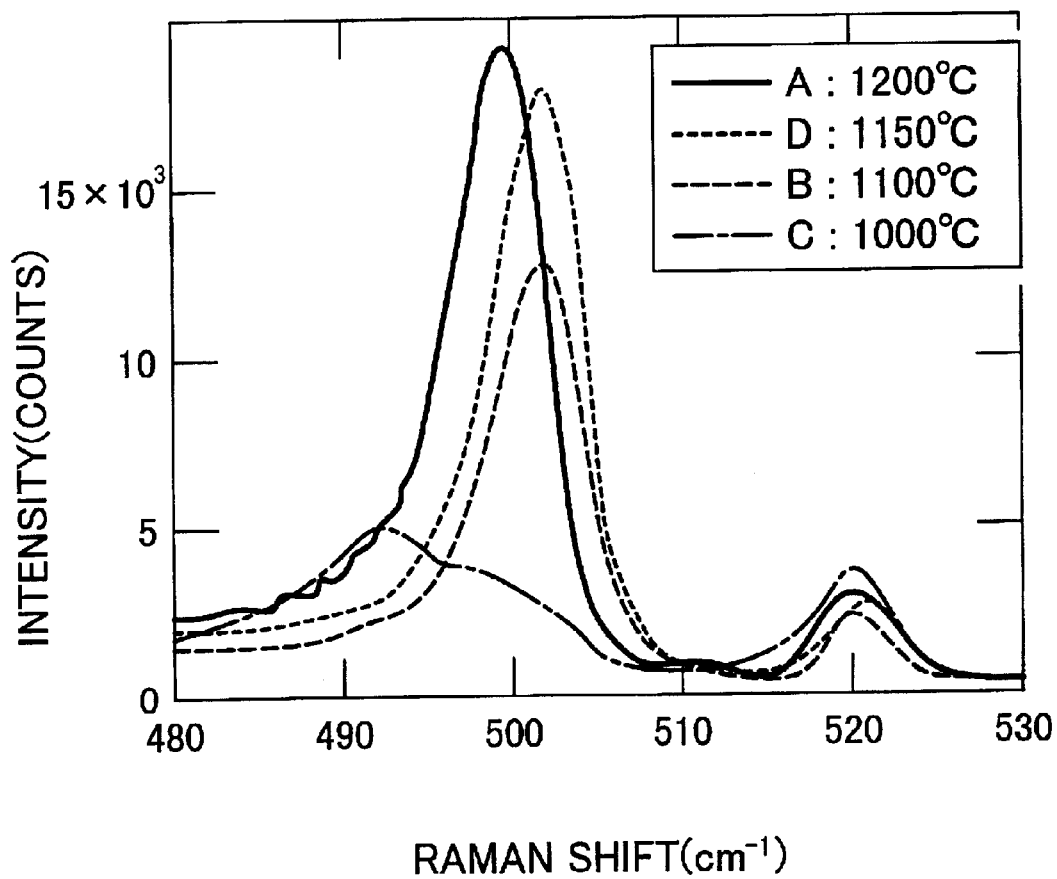
FIG. 3 is Raman spectra of the Si—Ge virtual substrate formed on an SOI substrate shown in Embodiment 1 of the invention.
Figure 4:
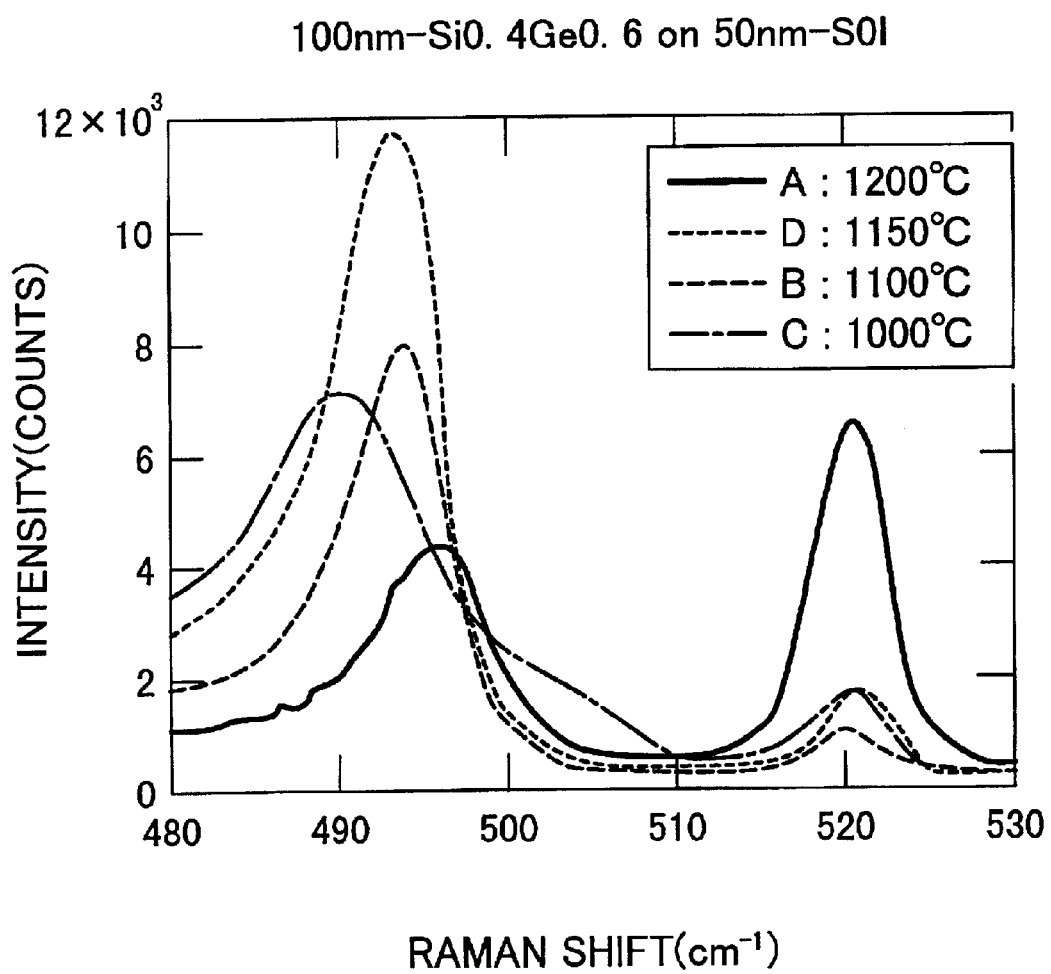
FIG. 4 is Raman spectra of another Si—Ge virtual substrate formed on the SOI substrate.

FIG. 3 shows Raman spectra for typical specimens heat treated at different temperatures each for 2 hours. FIG. 3 shows a specimen in which $Si_{0.55}Ge_{0.45}$ of 100 nm thickness was deposited on an SOI layer of 50 nm thickness which was finished into $Si_{0.7}Ge_{0.3}$ of 150 nm thickness after uniform Ge diffusion. FIG. 4 shows a specimen in which $Si_{0.4}Ge_{0.6}$ of 100 nm thickness was laminated on an SOI layer of 50 nm thickness finished into $Si_{0.6}Ge_{0.4}$ of 150 nm thickness. The Raman spectra are plotted by solid line, dotted line, broken line and dotted chain with respective heat-treatment temperatures of 1200, 1150, 1100 and 1000° C. In the graph, the peak on the left (lower wave number region) is a peak attributable to Si—Si oscillation in the Si—Ge layer and that on the right shows Si—Si oscillation peak in the silicon substrate.

Focusing attentions on the peak of the Si—Ge layer in FIG. 3, the specimen of 1200° C. annealing shown by the solid line has a peak which is in the lowest wave number region and has a strong intensity. The peak position situates at a position which corresponds to the Ge concentration just at 30% and in which strains are completely relaxed. It can be seen from the above that the Si—Ge layer and the Si layer are uniformly mixed together and thoroughly removed with strains by applying the heat treatment at 1200° C. On the contrary, a specimen heat treated at 1000° C. shown by the dotted chain gives a wide and spread peak width and has low intensity. Then, it can be seen that diffusion of Ge and strain relaxation are not yet sufficient by the heat treatment at 1000° C. for 2 hours.

Then, focusing attention on FIG. 4, it can be seen that a specimen heat treated at 1150° C. shown by the dotted line has a most intense peak and the strain relaxation is sufficient. On the contrary, a specimen heat treated at 1200° C. shows a broad peak width and has low intensity. In view of the phase diagram in FIG. 1, it can be seen that the specimen (that is, at the final Ge concentration of 40% in the specimen) is still in a partial melting state at 1200° C. That is, it can be seen that since the layer sandwiched with the SiO$_2$ layers is entirely melted, it is solidified into a polycrystalline state in the course of cooling after the heat treatment. As described above, it can be seen that the heat treatment temperature should optimally be set at a temperature as high as possible so that the Si—Ge layer situates under the solidus curve of the phase diagram at the completion point of the heat treatment in which Ge is diffused uniformly.

Figure 5:
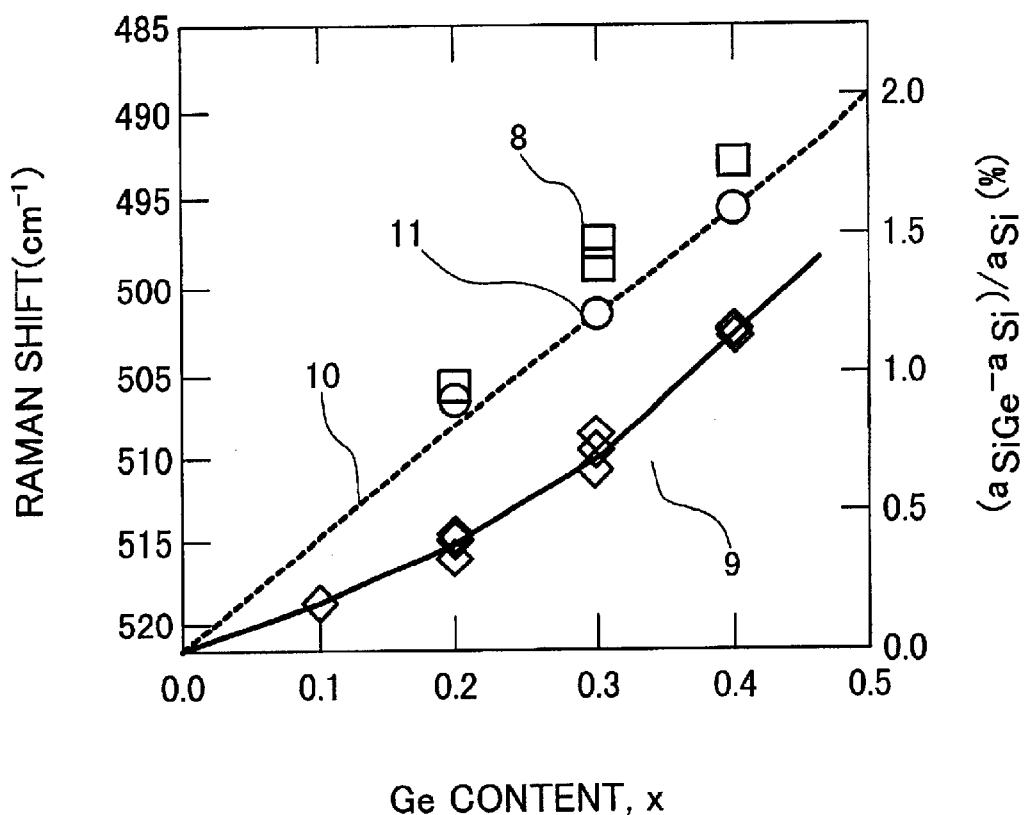
FIG. 5 is a graph showing the Raman shift and the lattice constant ratio to Si of a Si—Ge virtual substrate formed on the SOI substrate shown in Embodiment 1 of the invention.

FIG. 5 shows Raman shift values plotted relative to the specimens with the finished Si—Ge composition being varied. The lattice constant ratio relative to Si calculated from the Raman shift value is represented on the right hand axis of the graph. The characteristic of this embodiment is shown by Raman shift 8 (symbol □). On the other hand, in a case of a compositionally graded Si—Ge film by the existent MBE (Molecular Beam Epitaxy) is shown by reference 9 (symbol ◊). The Raman shift 8 of this embodiment is greater than the Raman shift 9 of the specimen produced by MBE. Further, the Raman shift 8 of this embodiment follows the dependence 10 (dotted line) assuming the Vegard's rule and it can be seen that it is substantially completely strain-relaxed.

Further, as a result of determining the lattice constant based on (0004) and (115) peak positions by X-ray diffraction method, this also shows that the strains have been completely relaxed since (1) the lattice constant is identical between the in-plane direction and the film thickness direction showing that the specimen forms cubic system and (2) the lattice constant 11 to Si (plotted as symbol ○ in FIG. 5) is in accordance with the Vegard's rule.

Figure 6:
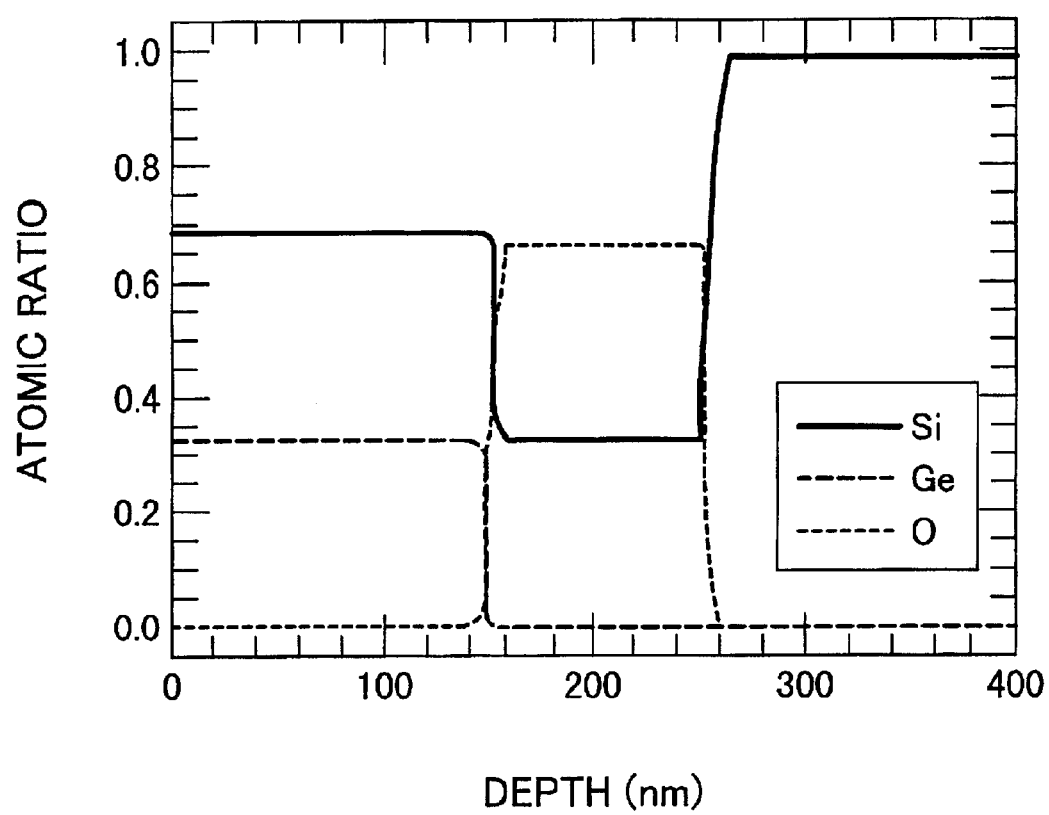
FIG. 6 is a graph showing the Ge distribution along the direction of depth in the Si—Ge virtual substrate formed on the SOI substrate in Embodiment 1 of the invention.

FIG. 6 shows the depth profiles of composition determined by Rutherford backward-scattering spectroscopy (RBS) measurement. The specimen used is a stack of $Si_{0.55}Ge_{0.45}$ of 100 nm thickness and an SOI (Si) layer of 50 nm thickness which is identical with that shown in FIG. 3 and which is to be finished as $Si_{0.7}Ge_{0.3}$ with 150 nm thickness. The surface oxide film was removed. It can be seen from FIG. 6 that the depth profile of composition is substantially as designed comprising an Si—Ge layer at 32% Ge concentration from the surface to a depth of 150 nm, $SiO_2$ to 250 nm thickness therefrom and, further, Si at the inside, as well as that the Ge concentration of the Si—Ge layer is also uniform.

Figure 7:
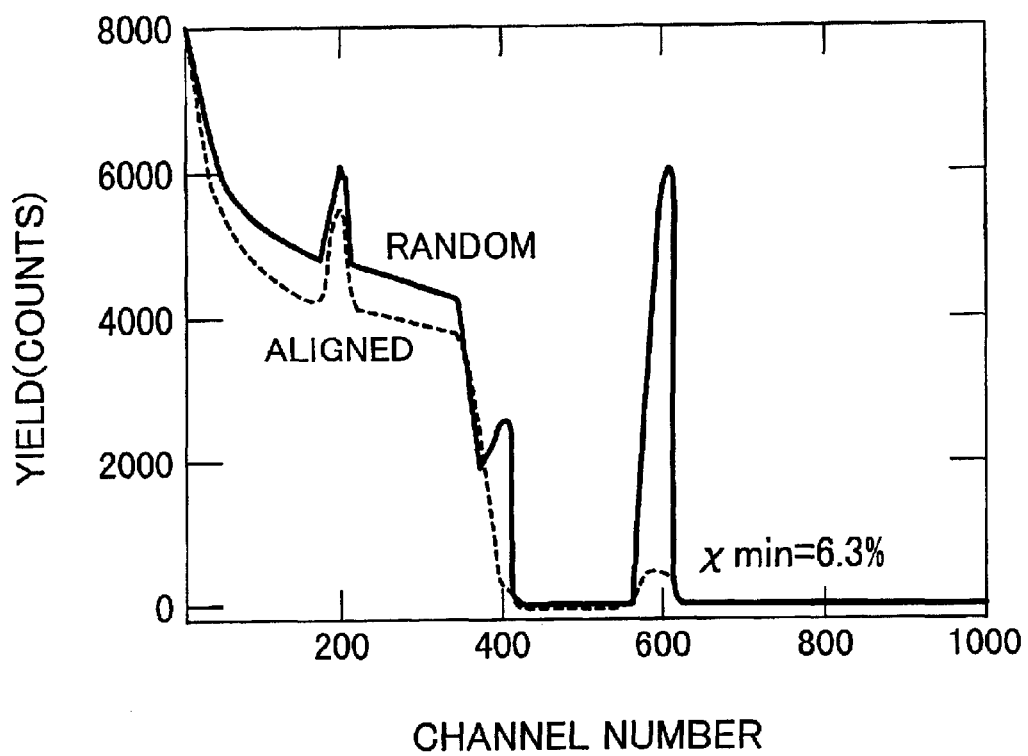
FIG. 7 shows Rutherford back scattering spectra of the Si—Ge virtual substrate formed on the SOI substrate in Embodiment 1 of the invention.
Figure 8:
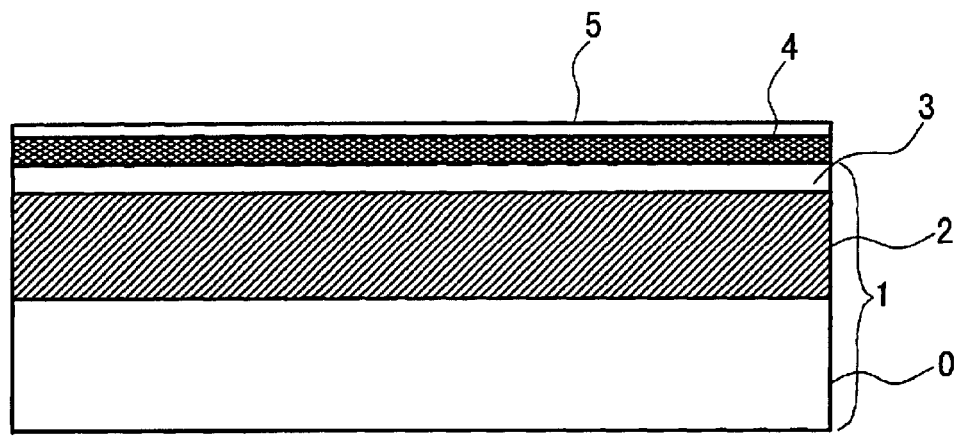
FIG. 8 is a cross sectional view of a substrate in accordance with the sequence of the production steps for the Si—Ge virtual substrate in Embodiment 2 according to the invention.

Random and aligned Yield were measured as shown in FIG. 7 in the same manner by RBS (Rutherford Backscattering Spectroscopy). The minimum value of the aligned yield ratio relative to the random yield as the index indicating the crystallinity is 6.3% showing that it has satisfactory crystallinity as the epitaxial thin film. Further, a rocking curve of (004) reflection by XRD (X-ray diffraction method) also showed a peak width corresponding to 150 nm thickness of the Si—Ge layer and it is excellent in crystallinity.

In the next place, changes in surface (interface) roughness at each of the steps for forming the strain-relaxed Si—Ge layer are to be explained. (1) The surface after MBE growth of Si—Ge and Si layers, (2) the interface between the $SiO_2$ layer and the Si layer after thermally oxidizing the Si layer, (3) the interface between the $SiO_2$ layer and the Si—Ge layer after the diffusion heat treatment were each observed by AFM (Atomic Force Microscopy). Note that the interface between the $SiO_2$ layer and the Si layer or the Si—Ge layer was observed after chemically removing the $SiO_2$ layer. Each of the observation areas is 2 μm square and the scale along the direction of the height is 20 nm only for the first specimen and 5 nm for the other specimens. In the first specimen, 50 nm Si and 100 nm $Si_{0.55}Ge_{0.45}$ were grown at 600° C. on a 50 nm SOI layer. In the second specimen, after forming an amorphous film of a composition identical with that of the first specimen at room temperature, it was put to solid phase crystallization (SPE) at 600° C. In the first specimen, the surface roughening due to strain relaxation occurs during MBE growing of the Si—Ge layer, and the surface roughness is as large as 2.1 nm (RMS). On the contrary, in the specimen where the amorphous film is put to solid phase crystallization, the surface roughness is remarkably reduced as small as 0.49 nm. It is considered that the surface roughening was suppressed because of solid phase crystallization in a state where the surface was covered with Si.

After that, in the specimen formed by oxidizing the second specimen at 900° C. for 50 min and then removing $SiO_2$ (third specimen) and in the specimen formed by thermally oxidizing the second specimen, applying diffusion heat treatment at 1200° C. for 2 hr and then removing $SiO_2$ (fourth specimen), the surface roughness was 0.48 nm and 0.39 nm, respectively. In the fourth specimen, fine undulations were eliminated and the surface was further flattened because of the high temperature heat treatment.

Subsequently, the surface of the specimen identical with the fourth specimen was etched chemically for defect observation and the surface was observed by an optical microscope. In the second specimen having the graded buffer layer, bright spots attributable to threading dislocations were observed in addition to the cross hatch-like contrast due to lattice relaxation. Since about 15 spots each about 50 μm square were observed, the threading dislocation density is about 600,000 per $cm^2$. On the contrary, in the specimen according to this embodiment, no threading dislocations were found within the observed range (for at least 0.1 $mm^2$). That is, it is estimated that the threading dislocation density is 1000 per $cm^2$ at the greatest. Specimens of strain-relaxed Si—Ge film capable of attaining such lower dislocation density have not yet been reported at all.

Embodiment 2

In Embodiment 2, an example of Ge diffusion not in a melting state is shown, particularly, by using a substrate in which device isolation regions are formed.

A description will be made of a method of forming trenches in an SOI substrate with an Si—Ge layer thereby isolating regions. The outline of the process is exemplified referring to FIG. 8 to FIG. 16. Each of the figures is a cross sectional view for a main portion of a device shown in accordance with the sequence of production steps in this embodiment.

(1) An Si—Ge layer 4 and an Si layer 5 are grown on an SOI substrate 1 (FIG. B). After chemically cleaning the SOI substrate 1, it was directly introduced into a low-pressure chemical vapor deposition chamber and put to hydrogen cleaning at 850° C. Then, after depositing an amorphous Si—Ge film at 450° C. using a monosilane gas and a germane gas as the starting material, supply of source gases was shut down and the film was crystallined in a hydrogen atmosphere at 750° C. In this step, the Si—Ge layer 4 was set to 45% Ge content and 50 nm thickness and the SOI film thickness 3 of the SOI substrate was set to 25 nm. If Ge was completely diffused in the two layers, an Si—Ge film 7 of 75 nm thickness and 30% of Ge content would be formed. Then an Si layer 5 was grown on the Si—Ge layer 4.

Figure 9:
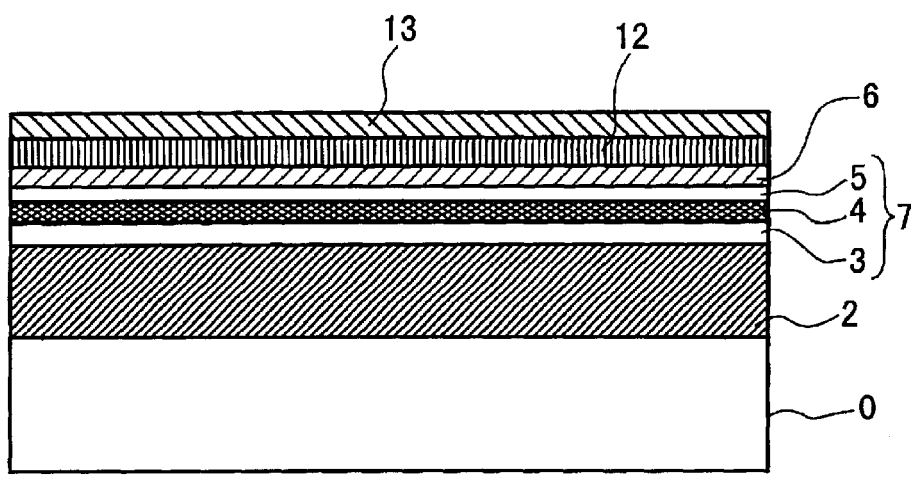
FIG. 9 is a cross sectional view of a substrate in accordance with the sequence of the production steps for the Si—Ge virtual substrate in Embodiment 2 according to the invention.

(2) After that, the surface Si layer 5 was thermally oxidized at 900° C. to form an $SiO_2$ layer 6 and, further, a poly-Si film 12 for CMP stopper, and an $SiO_2$ film 13 were deposited in this order by a CVD method (FIG. 9).

Figure 10:
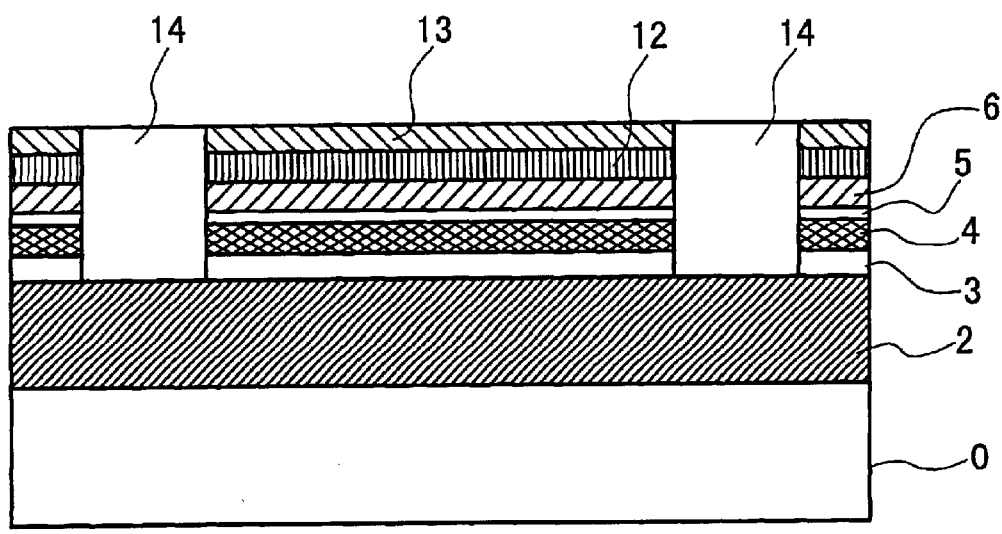
FIG. 10 is a cross sectional view of a substrate in accordance with the sequence of the production steps for the Si—Ge virtual substrate in Embodiment 2 according to the invention.

(3) Then, trenches 14 for device isolation were formed by using photolithography and dry etching (FIG. 10). The trench was in a square shape of 2 μm square and a trench width was 0.2 μm. Further, the trench was formed to such a depth that the Si—Ge layer 4 and the SOI layer 3 were completely removed and the trench reached the buried insulating film 2 of the SOI substrate.

Figure 11:
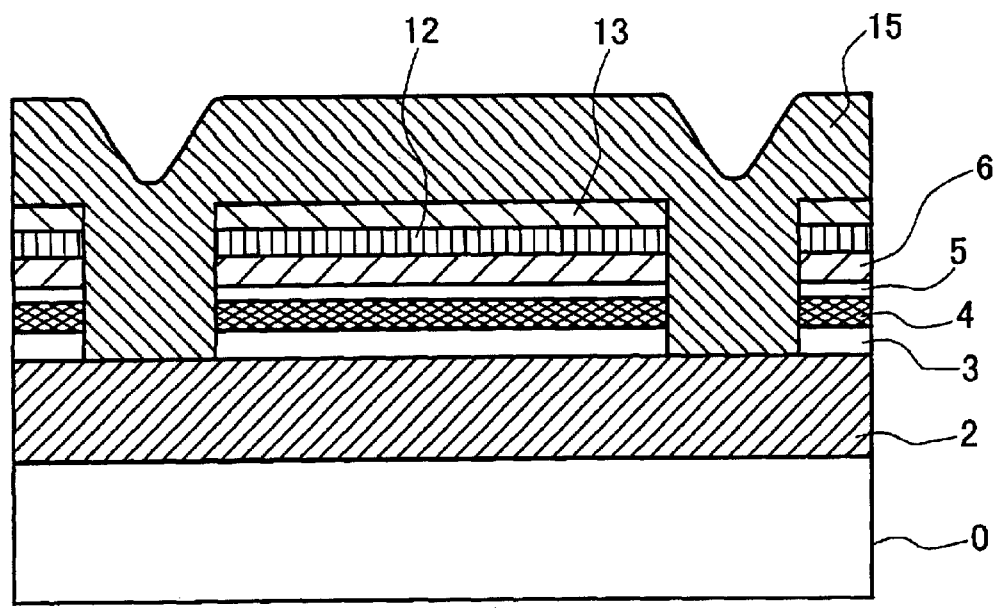
FIG. 11 is a cross sectional view of a substrate in accordance with the sequence of the production steps for the Si—Ge virtual substrate in Embodiment 2 according to the invention.

(4) Subsequently, an SiO$_2$ film 15 was filled in the inside and at the periphery of the trenches (FIG. 11).

Figure 12:
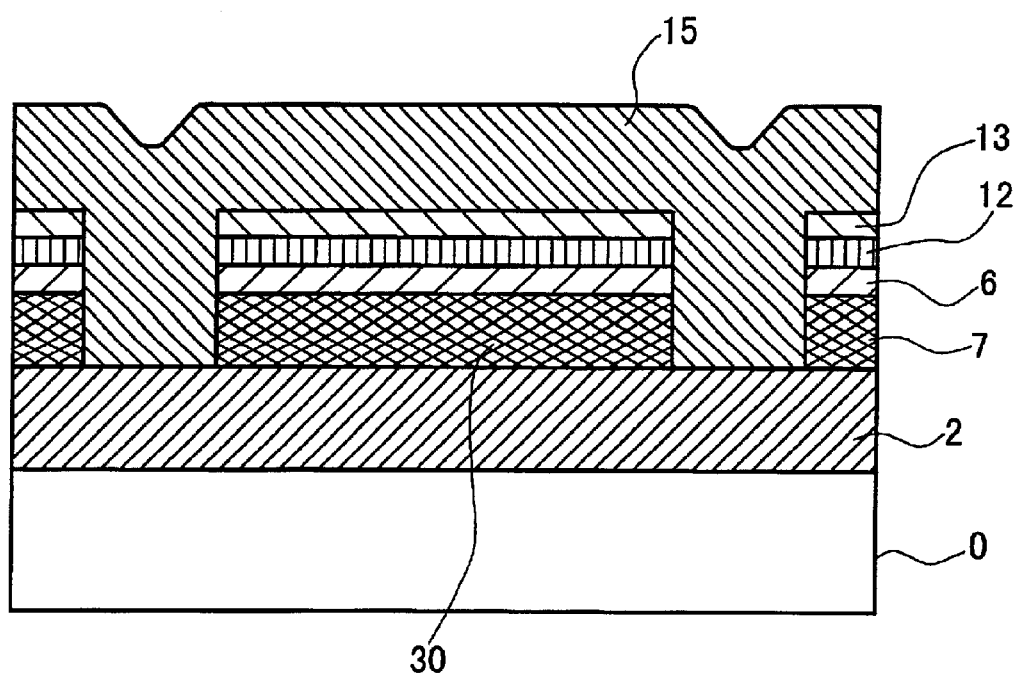
FIG. 12 is a cross sectional view of a substrate in accordance with the sequence of the production steps for the Si—Ge virtual substrate in Embodiment 2 according to the invention.

(5) In this state, diffusion of Ge and strain relaxing heat treatment were conducted at 1120° C. for 6 hr (FIG. 12). A layer 30 represents the Si—Ge layer after completing the heat treatment.

Figure 13:
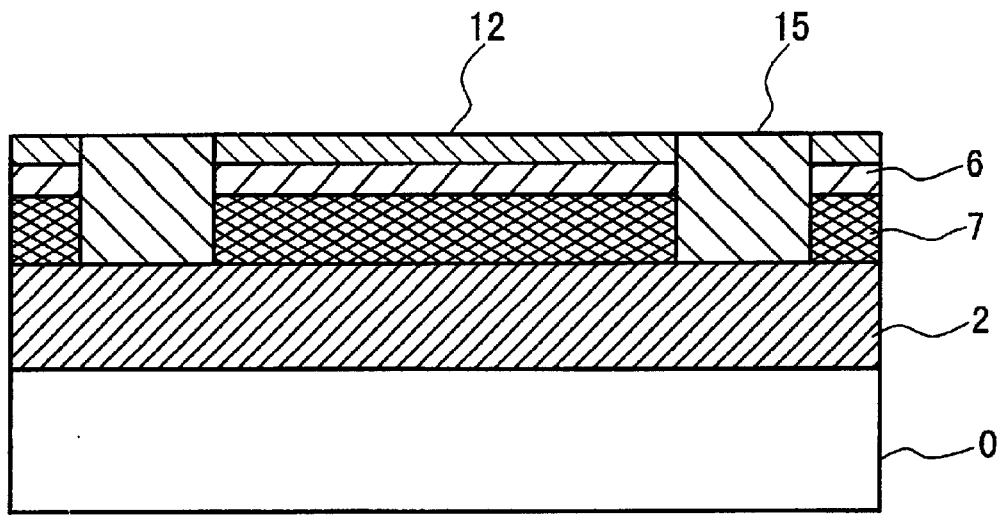
FIG. 13 is a cross sectional view of a substrate in accordance with the sequence of the production steps for the Si—Ge virtual substrate in Embodiment 2 according to the invention.

(6) It was polished by a CMP till reaching the poly-Si stopper layer 12 and planarized (FIG. 13).

Figure 14:
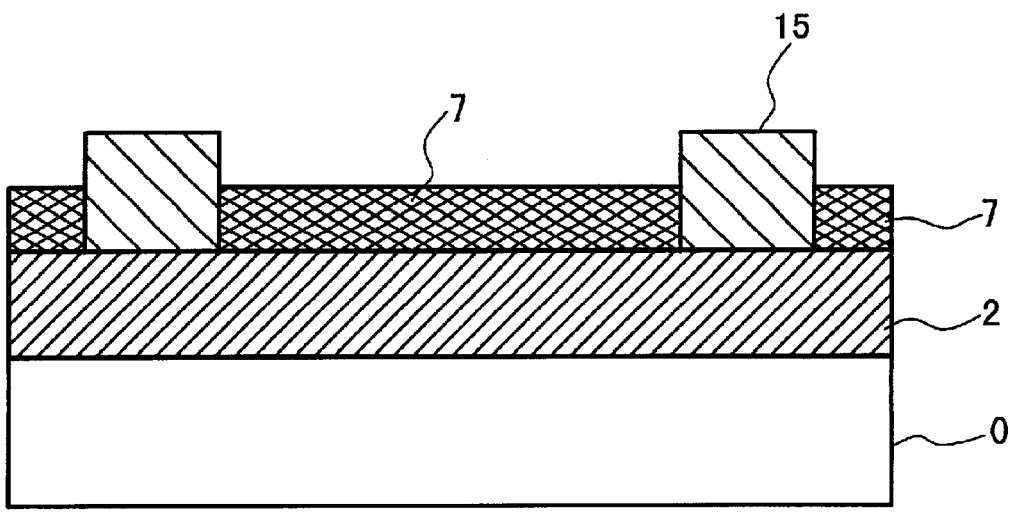
FIG. 14 is a cross sectional view of a substrate in accordance with the sequence of the production steps for the Si—Ge virtual substrate in Embodiment 2 according to the invention.

(7) The poly-Si layer 12 and the SiO$_2$ layer 6 were removed to expose the Si—Ge layer 7 (FIG. 14).

Figure 15:
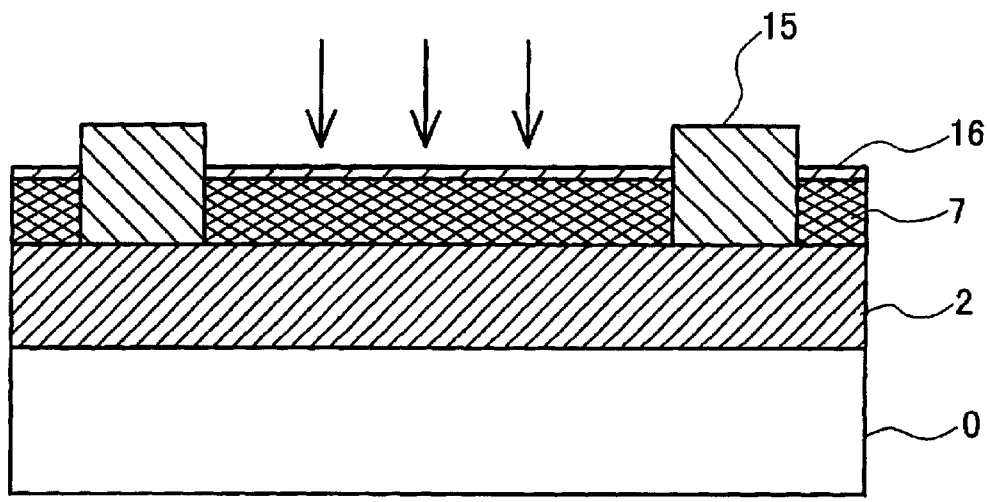
FIG. 15 is a cross sectional view of a substrate in accordance with the sequence of the production steps for the Si—Ge virtual substrate in Embodiment 2 according to the invention.

(8) After forming a thin surface oxide film 16 (5 nm) by a CVD method, well-forming implantation and activating annealing were performed (FIG. 15).

Figure 16:
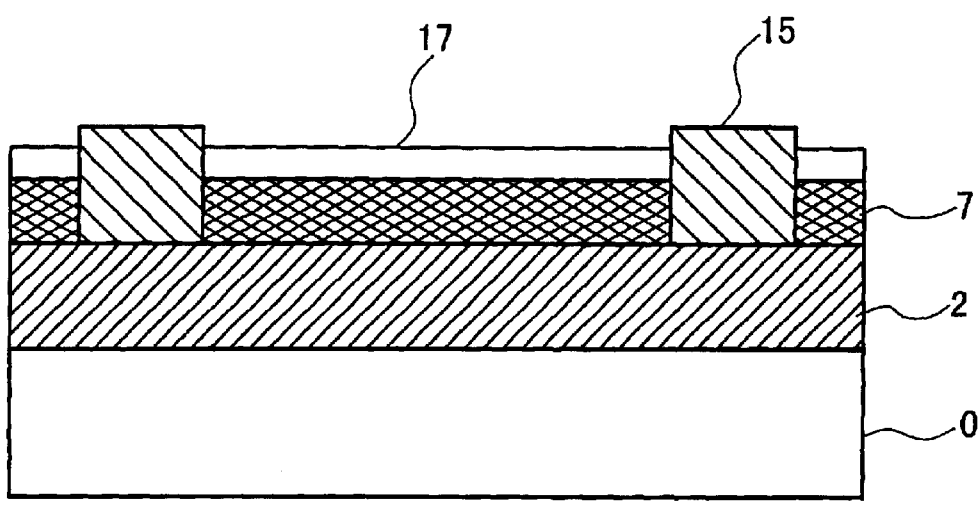
FIG. 16 is a cross sectional view of a substrate in accordance with the sequence of the production steps for the Si—Ge virtual substrate in Embodiment 2 according to the invention.

(9) After removing the oxide film 16, a strained Si layer 17 of 20 nm thickness was selectively grown by a low pressure CVD method to complete a Si—Ge virtual substrate (FIG. 16).

When Raman scattering was measured in the same manner as in Embodiment 1, it was found that strains were sufficiently relaxed and Ge was sufficiently diffused although not by way of the melting state under this condition as apparent from the relation between the heat treatment temperature and the composition in FIG. 1. When defect observation was conducted for the portion surrounded with the device isolation region, the presence of defects was not recognized in any region. The surface flatness was identical with that in Embodiment 1 and the surface roughness was 0.41 nm. Because of the restriction of the region, defects are released toward the device isolation region and it can be seen that the less defect strain-relaxed Si—Ge layer was formed.

Embodiment 3

In Embodiment 3, a substrate was formed by the same process as in Embodiment 2. However, in the process (5) above, the heat treatment temperature was increased to 1200° C. and the heat treatment time was shortened to 2 hr. Also in this case, it was confirmed that strains were relaxed sufficiently, Ge was diffused uniformly, and defects were not observed over the entire region surrounded with the device isolation region like that in Embodiments 1 and 2. Further, the surface roughness was 0.26 nm showing that the planarization proceeded further by restricting the region.

Embodiment 4

Figure 17:
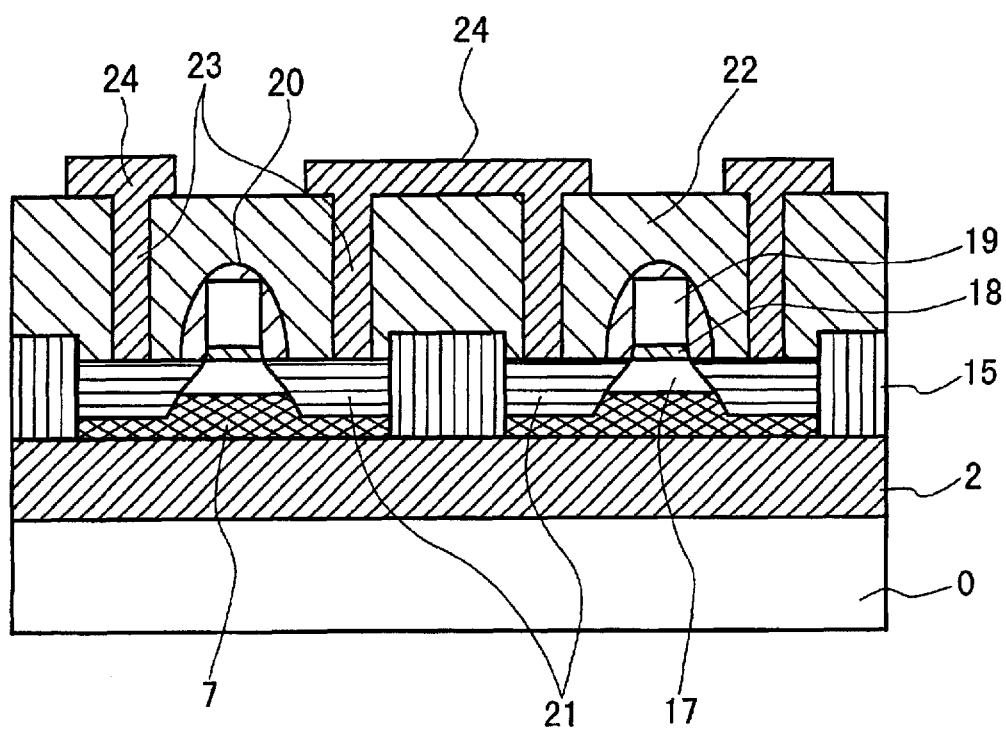
FIG. 17 is a cross sectional view of an example of a complementary field effect semiconductor device produced by using a Si—Ge virtual substrate in Embodiment 4 according to the invention.

In Embodiment 4, the steps of obtaining a strain-relaxed Si—Ge virtual substrate by the same process as that in Embodiment 3 and producing a complementary field effect semiconductor device thereto is explained. A description is to be made with reference to a cross sectional view of the device shown in FIG. 17. In the step (9) of Embodiment 3, a device isolation region, a well region and a strained Si channel were formed already by using various techniques usually adopted in the field of semiconductor devices. In the well forming process, phosphorus ion is implanted in a region for forming a p-type transistor to change the conduction type to n-type and boron is ion implantated into a region for forming an n-type transistor to change the conduction type into p-type.

Subsequently, after chemically cleaning the strained Si layer on the surface, it was immediately introduced into an oxidizing furnace to form a gate oxide film 18 of 2 nm thickness at 800° C. and, successively, CVD of the gate poly-silicon film 19 was done. Boron and phosphorus were ion implanted to the gate poly-silicon films of p-type and n-type transistors, respectively, in order to optimize the threshold voltage. Then, a gate was defined by KrF photolithography and dry etching, and ion implantation was conducted to a halo type punchthrough stopper and source-drain extension regions. Further, after forming a gate side wall 20 with deposition of SiO$_2$ film by a CVD method and dry etching, ion implantation was conducted into the source·drain region 21 to complete a main portion of a CMOSFET. Further, formation of an interlayer insulating film 22, contact holes 23 and wirings 24 were conducted to complete the process fabricating a semiconductor device of this embodiment.

The transistor completed by way of the process described above can attain the improvement in the current driving performance by at least 60% compared with usual SOI-CMOS transistors having the same gate length and oxide film thickness, since the strains are applied by the strain-applying semiconductor layer to the channel, the interface between the strained Si channel and the gate oxide film is extremely flat and the defect density is as low as 1000/cm$^2$ or less in the Si—Ge layer and the strained Si layer. Further, an ideal value of 68 mV/dec can be attained in the sub-threshold swing which has been difficult to be lower than 80 mV/dec in existent strained Si-CMOS and the stand-by power consumption can also be reduced.

As described above, this invention can provide a complementary field effect transistor with high operation speed and low consumption power, as well as a semiconductor device incorporating the same.

This invention can provide a method of producing a novel SOI substrate for use in a semiconductor device which is sufficiently planar and has fewer defects, as well as a method of producing a high-performance semiconductor device using the same.

Main references are as described below: 0: silicon substrate, 1: SOI substrate, 2: buried insulating layer, 3: SOI layer, 4: Si—Ge layer, 5: Si layer, 5a: Si layer left by oxidation, 6: SiO$_2$ layer, 7: Si—Ge layer after diffusion heat treatment, 8: Raman shift of the Si—Ge layer after diffusion heat treatment, 9: Raman shift in the case of the compositionally graded Si—Ge film, 10: dependence obeying Vegard's rule, 11: lattice constant ratio relative to Si, 12: poly-Si film as CMP stopper, 13: SiO$_2$ film, 14: device isolation trench, 15: device isolation insulating film, 16: screening oxide film for ion implantation, 17: strained Si layer, 18: gate oxide film, 19: gate polysilicon film, 20: gate side wall, 21: source-drain region, 22: interlayer insulating film, 23: contact hole, 24: wiring.

What is claimed is:

1. A method of producing a substrate for use in a semiconductor device comprising the steps of:

forming a mixed alloy layer of silicon and germanium on a single crystalline silicon layer formed on an insulating layer, at least partially melting the mixed alloy layer of silicon and germanium at a temperature higher than a solidus curve determined by the germanium content of the mixed alloy layer of silicon and germanium and lower than a solidus curve determined by the germanium content of a mixed alloy layer formed by combination of the single crystalline silicon layer and the mixed alloy layer of silicon and germanium; and solidifying the mixed alloy layer of silicon and germanium while lowering the germanium content in the at least partially molten mixed alloy layer of silicon and germanium.

2. A method of producing a substrate for use in a semiconductor device as defined in claim 1, further comprising forming at least one of a silicon layer and an insulating layer on the mixed alloy layer of silicon and germanium before the step of melting the mixed layer of silicon and germanium.

3. A method of producing a substrate for use in a semiconductor device as defined in claim 2, wherein the step of forming the at least one of the silicon layer and the insulating layer on the mixed alloy layer of silicon and germanium comprises forming the silicon layer on the mixed alloy layer of silicon and germanium and then oxidizing at least a portion of the silicon layer.

4. A method of producing a substrate for use in a semiconductor device as defined in claim 1, wherein the at least partially melting step and the solidifying step are performed in a non-oxidative atmosphere.

5. A method of producing a substrate for use in a semiconductor device as defined in claim 1, further comprising the step of forming electrically isolated regions on the main surface of a laminated body of the single crystal silicon layer and the mixed alloy layer of silicon and germanium before the step of at least partially melting the mixed alloy layer of silicon and germanium.

6. A method of producing a substrate for use in a semiconductor device as defined in claim 5, wherein the step of forming electrically isolated regions on the main surface of the laminated body of the single crystal silicon layer and the mixed alloy layer of silicon and germanium comprises the steps of forming a trench in the laminated body of the single crystalline silicon layer and the mixed alloy layer of silicon and germanium and forming electrically insulating material within the trench.

7. A method of producing a semiconductor device comprising, forming at least a single crystal silicon layer on a substrate by the method of claim 1, and forming a semiconductor element using the single crystal silicon layer as a material.

8. A method of producing a substrate for use in manufacture of a semiconductor device comprising, providing an insulating substrate, forming on said insulating substrate a first layer, having a first thickness, of single crystal silicon;

forming on said first layer of single crystal silicon a second layer, having a second thickness, of a first mixed alloy of silicon and germanium having a first predetermined proportion of germanium and a first melting point;

said insulating substrate, said first layer and said second layer forming an assembly of layers;

wherein, said first thickness of said first layer, said second thickness of said second layer and said first predetermined proportion of germanium are selected to produce a second mixed alloy of silicon and germanium having a second predetermined proportion of germanium and a second melting point, higher than said first melting point, when said first and second layers are combined to form a combined layer;

heating said assembly of layers to an initial temperature greater than said first melting point of said first mixed alloy and below said second melting point of said second mixed alloy, whereby germanium diffuses from said second layer into said first layer; and maintaining said assembly of layers at a temperature such that at least a portion of said first thickness of said first layer in contact with said insulating substrate is not melted, for a period of time sufficient to allow said diffusion of germanium from said second layer into said first layer to form said combined layer.

9. The method of claim 8, further comprising, before said step of heating said assembly of layers, forming on said second layer a third layer of silicon, whereby said assembly of layers additionally comprises said third layer.

10. The method of claim 9, further comprising, before said step of heating said assembly of layers, forming on said third layer a fourth layer of an insulating material, whereby said assembly of layers additionally comprises said fourth layer.

* * * * *